United States Patent
Bortolini

(10) Patent No.: US 6,650,750 B1
(45) Date of Patent: Nov. 18, 2003

(54) VOICE NOTIFICATION FOR A BATTERY ALARM IN A NETWORK INTERFACE UNIT

(75) Inventor: Edward J Bortolini, Nederland, CO (US)

(73) Assignee: Lucent Technologies Inc., Murray Hill, NJ (US)

(*) Notice: Subject to any disclaimer, the term of this patent is extended or adjusted under 35 U.S.C. 154(b) by 602 days.

(21) Appl. No.: 09/641,482

(22) Filed: Aug. 18, 2000

(51) Int. Cl.[7] .............................................. H04M 1/00
(52) U.S. Cl. .................... 379/413; 379/413.02; 379/33; 379/41; 379/45
(58) Field of Search ...................... 379/413.02, 399.01, 379/413.03, 413.04, 413, 413.01, 324, 323, 33, 37, 39, 40, 41, 45, 48

(56) References Cited

U.S. PATENT DOCUMENTS

| | | | | | |
|---|---|---|---|---|---|
| 5,566,339 A | * | 10/1996 | Perholtz et al. | ................. | 379/38 |
| 5,646,606 A | * | 7/1997 | Wilson et al. | ......... | 340/825.37 |
| 5,761,312 A | * | 6/1998 | Zelikovitz et al. | ....... | 379/90.01 |
| 6,144,848 A | * | 11/2000 | Walsh et al. | ................. | 455/419 |
| 6,452,490 B1 | * | 9/2002 | Garland et al. | ............. | 340/506 |

* cited by examiner

*Primary Examiner*—Rexford Barnie

(57) ABSTRACT

Transmitting a pre-recorded announcement to the user of an network interface unit (NIU) each time the user places a telephone call if an alarm is set because a battery in an uninterruptible power supply (UPS) is in a low power state. The pre-recorded announcement states that the battery needs to be replaced. The user is given a simple procedure for contacting service personnel at a service center to have the battery replaced in the UPS. In addition, this announcement is overridden if the user starts to dial the emergency telephone number (911). This allows the user to gain immediate access to the emergency telephone number without having to listen to the message stating that the battery in the UPS needs to be replaced. An indicator is also set on NIU upon the battery being in the low power state. If a call is completed to the service center, the alarm is reset for a predetermined amount of time to give the service personnel time to service the battery.

12 Claims, 3 Drawing Sheets

FIG. 2

VOICE NOTIFICATION FOR A BATTERY ALARM IN A NETWORK INTERFACE UNIT

TECHNICAL FIELD

This invention relates to cable broadband or wireless apparatus and, in particular, to the notification of a battery alarm in an uninterruptible power supply (UPS).

BACKGROUND OF THE INVENTION

When broadband access apparatus, such as cable or fixed wireless, is used to provide primary line telephone service, it is necessary to provide uninterruptible power supply service for endpoints so as to provide emergency service i.e., 911 calls. This is necessary since the network interface unit (NIU) or wireless adapter does not obtain its power from a telephone central office but rather must rely on power provided within the residence or business. Uninterruptible power supplies (UPS) that provide power from a battery when the main AC supply fails are well known in the art. However, a problem that exists with UPS's is the problem of detecting and replacing batteries that fail in these UPS's. Within the prior art, it is well known to use visual indicators and audio alarms to notify users that a battery has failed in a UPS. In addition, expensive and costly records are maintained to manage replacement schedules. Such prior art techniques work well within an environment where trained service personnel are on-site or make frequent visits to the sites.

However, in the case of NIU's, these units reside in residences and in small businesses where service personnel do not make routine visits. Visual indicators and audible alarms can also be used in the wireless units and NIU's but the effectiveness of these methods is greatly diminished. The user will often choose to ignore a visual indicator. With respect to audio alarms, such alarms must be able to be disabled since it may be a number of hours or even days before a service person can reach the residence to replace the battery. The result is that the users disable the audio alarm and then, not bother to call the service personnel to replace the battery in the UPS. This has left the providers providing service via the NIU's and wireless units in a quandary because of the problems and liabilities associated with maintaining and replacing the batteries in the UPSs because of the requirements placed on these service providers to provide primary line telephone emergency service.

SUMMARY OF THE INVENTION

The foregoing problem is solved and a technical advance is achieved by an apparatus and method that transmits a pre-recorded announcement to the user of an network interface unit (NIU) each time the user places a telephone call if an alarm is set because a battery in an uninterruptible power supply (UPS) is in a low power state. The pre-recorded announcement states that the battery needs to be replaced. Advantageously, the user is given a simple procedure for contacting service personnel at a service center to have the battery replaced in the UPS. In addition, this announcement is overridden if the user starts to dial the emergency telephone number (911). This allows the user to gain immediate access to the emergency telephone number without having to listen to the message stating that the battery in the UPS needs to be replaced. Advantageously, an indicator is also set on NIU upon the battery being in the low power state. If a call is completed to the service center, the alarm is reset for a predetermined amount of time to give the service personnel time to service the battery.

These and other features and advantages of the invention will become apparent from the following description of the illustrated embodiment of the invention considered together with the drawing.

DETAILED DESCRIPTION

Figure 1:
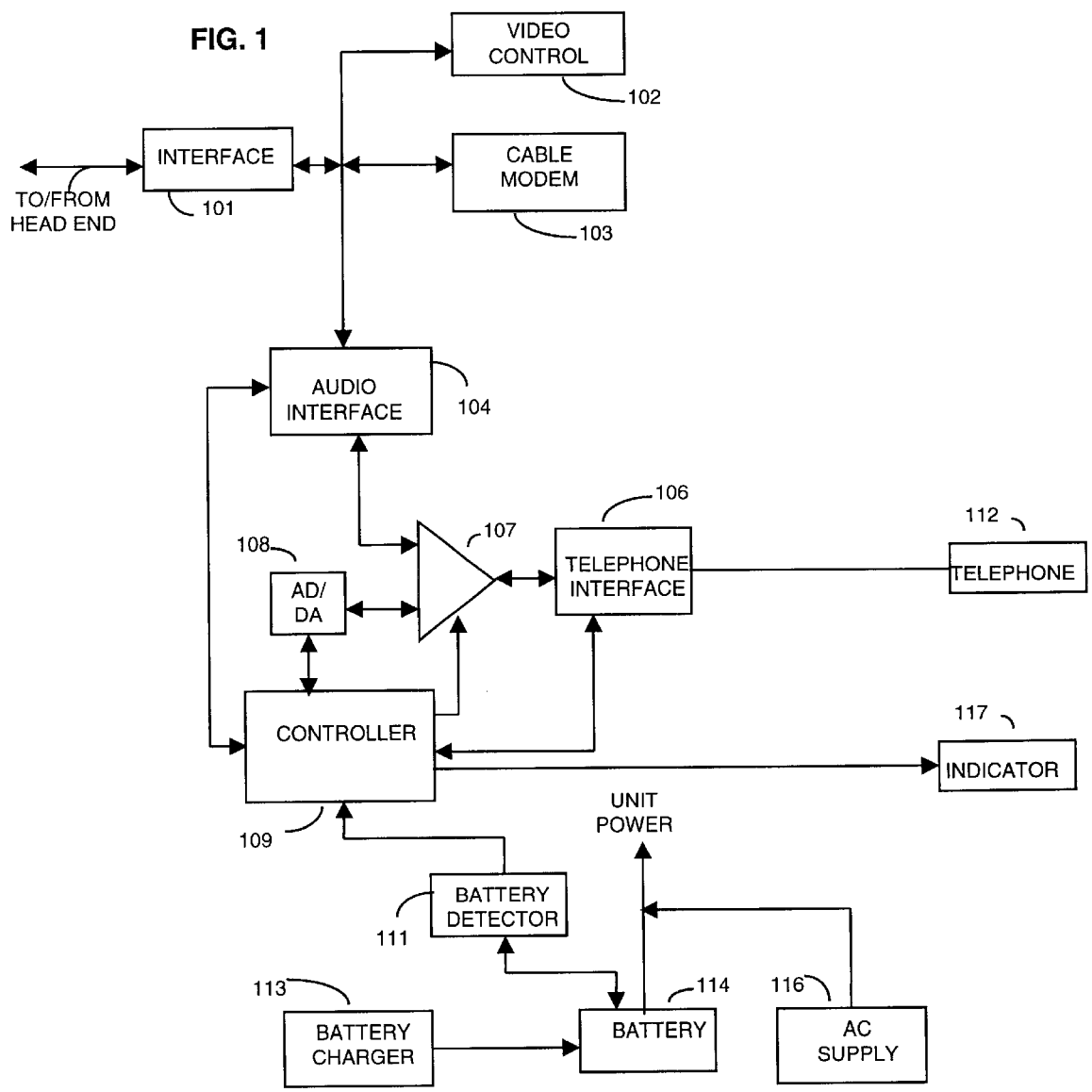
FIG. 1 is a block diagram of a cable unit for implementing the invention.

FIG. 1 illustrates, in block diagram form, an apparatus for implementing the invention. Interface 101 interfaces with the cable that is transmitting and receiving signals from the head end of the cable system. Interface 101 is in communication with video control 102, cable modem 103, and audio interface 104. Video control 102 and cable modem 103 are not discussed but they provide the video and data communication with the head end. Controller 109 provides overall control of the apparatus illustrated in FIG. 1. Audio interface 104 receives and transmits audio information with the head end via interface 101. Multiplexer 107 under control of controller 109 can communicate audio information with AD/DA converter 108 or audio interface 104. Telephone interface 106 provides the standard telephone interface for telephone 112. Telephone interface 106 provides the power on the tip and ring to telephone 112 and receives and transmits audio information from multiplexer 107. Unit power is supplied to the apparatus at FIG. 1 from AC supply 116 in normal operating conditions. However, if the AC power should fail, battery 114 supplies power. Note, that it is well known in the art that battery 114 in case of failure would only supply power to those units necessary for telephone 112 to receive and make telephone calls.

Battery 114 is kept in the charge state by battery charger 113. Battery detector 111 determines when battery 114 has failed and transmits an alarm to controller 109. Controller 109 can control battery detector 111 to turn this alarm off for a predetermined amount of time so that maintenance personnel can service battery 114. However, if battery 114 is still failing after this predetermined amount of time, battery detector 111 sends an alarm once again to controller 109.

In normal operation, controller 109 communicates control information concerning telephone calls and other aspects of the apparatus with the head end via audio interface 104. When an incoming call is received from the head end, controller 109 enables telephone interface 109 to alert telephone 112. Controller 109 then determines when telephone 112 has answered the alerting, and interconnects telephone 112 to the head end via telephone interface 106, multiplexer 107, and audio interface 104. In the normal situation for call origination, controller 109 detects when telephone 112 goes off hook and establishes the necessary signaling with the head end to allow telephone 112 to establish an outgoing call. Note, that telephone 112 can dial the destination telephone number directly to the head end using multi-frequency tones, or controller 109 can interpret the multi-frequency tones and transmit the destination telephone number via a separate control channel to the head end.

When battery 114 fails, battery detector 111 transmits, an alarm signal to controller 109. As is discussed in greater detail with respect to FIG. 2, controller 109 is responsive to the alarm from battery detector 111 to transmit a voice message to telephone 112 the next time telephone 112 attempts to perform a call origination. An exception to this operation is if controller 109 detects that telephone 112 is dialing the emergency telephone number e.g., 911. If telephone 112 is dialing the emergency telephone number, controller 109 will not transmit the battery alert message to telephone 112.

The battery alarm message could advantageously state, "Your telephone emergency batteries need replacement.

Press the digits 'xyz' to schedule an appointment with your service provider". The digits "xyz" would be chosen to be digits that normally would not be dialed such as "000". If the user indicates that indeed they wish to contact the service provider by dialing the requested digits, controller 109 establishes a call to the maintenance center and assures that the call was received and answered by the maintenance center. Once the call had ended with the maintenance center, controller 109 instructs battery detector 111 to reset the battery alarm for a predetermined amount of time. If the predetermined amount of time elapses, and battery 114 is still in a failed state, battery detector 111 once again sends an alarm signal to controller 109. In addition, to sending a voice message to telephone 112, controller 109 also sets indicator 117 upon the occurrence of the alarm signal. Indicator 117 can be a visual or audio indicator. One skilled in the art can readily see that this resetting of the alarm for a predetermined amount of time could be performed by controller 109 through software methods.

Figure 2:
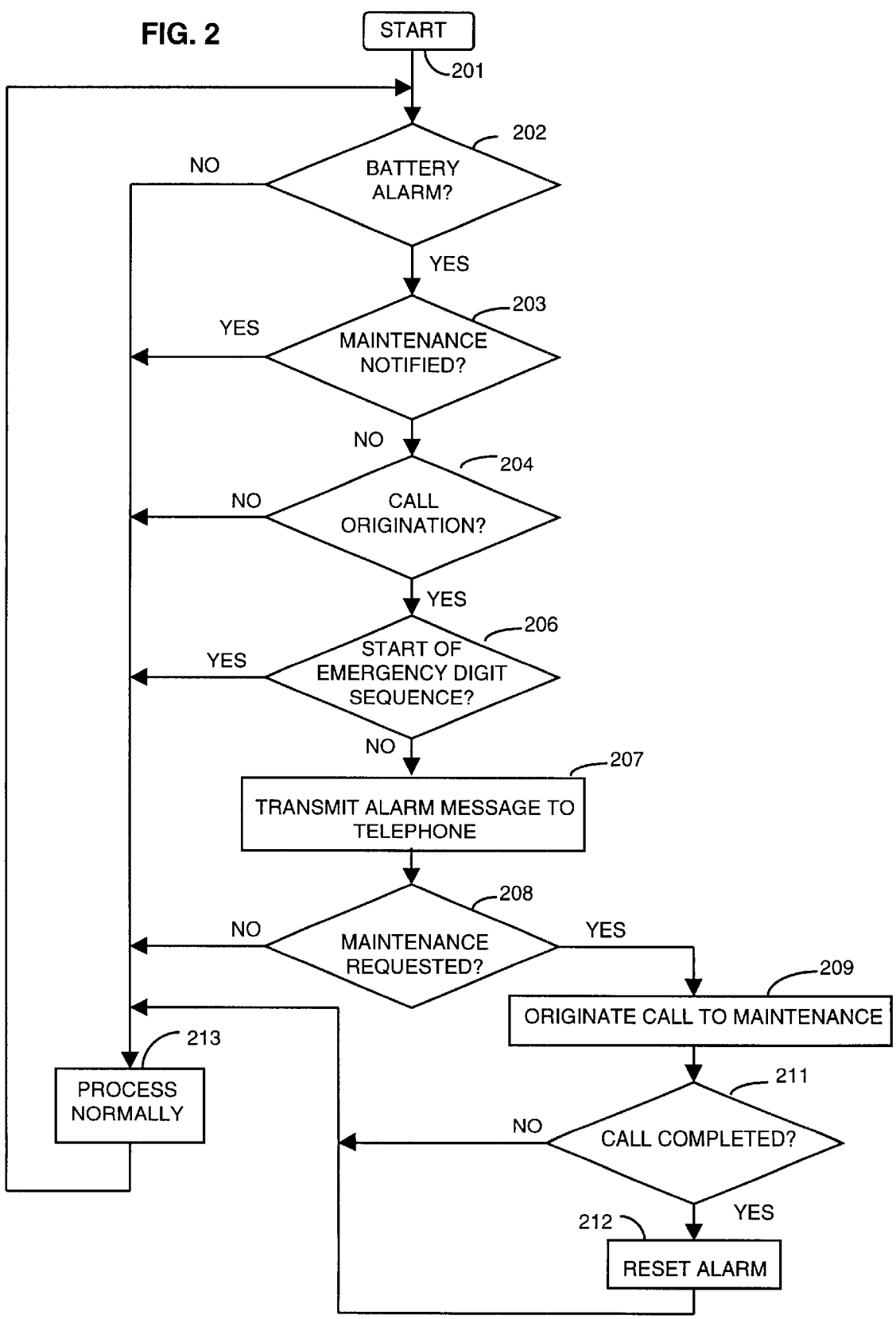
FIG. 2 illustrates, in flowchart form, steps performed by a unit in implementing the invention.

FIG. 2 illustrates the steps performed by controller 109 in implementing the invention. After being started in block 201, decision block 202 determines if a battery alarm is being received from the battery detector. If the answer is no in decision block 202, control is passed to block 213 that performs normal processing on the stimuli. This normal processing consists of doing nothing if there is no stimuli, responding to an incoming call, placing an outgoing call, etc. If a battery alarm is being received, control is passed to decision block 203 that determines whether or not the maintenance center has been notified as will be discussed in block 209. If the answer is yes, control is transferred once again to block 213 which processes the stimuli in a normal manner before returning control back to decision block 202. If the response in decision block 203 is no, control is transferred to decision block 204. The latter decision block determines if the telephone is originating a call. If the answer is no control is transferred to block 213. If the answer in decision block 204 is yes, control is transferred to decision block 206 which determines if the call origination is being placed to the emergency number by examining the initial dialed digits for the emergency digit sequence. If the user of the telephone is placing a call to the emergency number, control is transferred to block 213 so that this emergency call can be processed in a normal manner. If decision block 206 determines that a call is not being placed to the emergency number, control is transferred to block 207 which transmits the alarm message to telephone so that the user can respond or not.

After execution of block 207, decision block 208 determines if the user is requesting to be connected to the maintenance center in response to the transmitted alarm message. If the answer is no, control is transferred to block 213. If the answer is yes, control is transferred to block 209 that originates a call to the maintenance center before transferring control to decision block 211. The latter decision block determines if the call has been completed to the maintenance center. If the answer is no, the user is allowed to proceed with the outgoing call that they were originating by control being transferred to block 213. In this situation, the next time that the user originates a call they will once again receive the pre-recorded announcement. If the call to the maintenance center is completed successfully, control is passed to block 212 which transmits a signal to battery detector 111 to reset the alarm for a predetermined period before transferring control to block 213.

Figure 3:
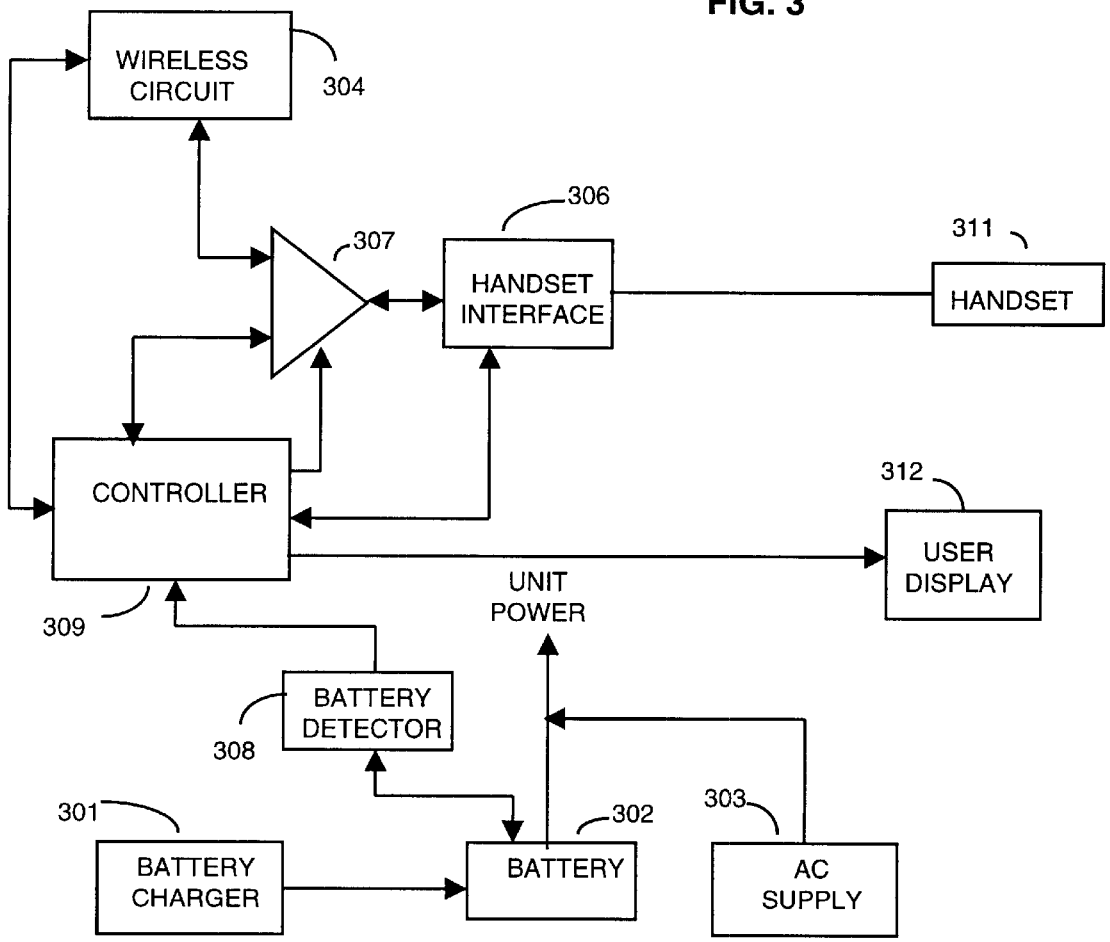
FIG. 3 illustrates, in block diagram form, a wireless unit for implementing the invention.

FIG. 3 illustrates an embodiment of the invention for performing operations in a fixed wireless system. Wireless circuit 304 performs all of the wireless operations under the control of controller 309. In implementing the invention, controller 309 performs the steps illustrated in FIG. 2. Handset interface 306 performs the analog to digital conversions and also provides ringing and other types of signaling for handset 311. Multiplexer 307 is utilized to communicate audio information with either wireless circuit 304 or controller 309. User display 312 is utilized to communicate information to the user of handset 311. Elements 301–303 and 308 perform the same functions as elements 113–116 and 111 of FIG. 1.

Of course, various changes and modifications to the illustrative embodiment described above will be apparent to those skilled in the art. For example, controller 109 could immediately upon receiving the alarm signal from battery detector 111 place a call to telephone 112 and transmit the alarm message to telephone 112 at that time. Such changes and modifications can be made without departing from the spirit and scope of the invention and without diminishing its attendant advantages. It is therefore intended that such changes and modifications be covered by the following claims except insofar as limited by the prior art.

What is claimed is:

1. A method providing of a battery alarm for a battery in an uninterruptible power supply of a local control unit providing service for a telephone, comprising the steps of:

generating an alarm when the battery is in a low power state by a battery detector in the local control unit;

determining that the battery is in the low power state by a presence of the alarm;

detecting a call origination by the telephone;

transmitting a voice message to the telephone in response to a call origination upon the call origination being for a non-emergency call where the voice message informs the user that the battery is in the low power state before allowing user to continue with the call origination;

providing a user of the telephone abbreviated dialing to originate another telephone call to a service center for the local control unit; and resetting the alarm for a predetermined amount of time upon the other telephone call being completed to the service center.

2. The method of claim 1 wherein the step of determining comprises the step of setting an indicator on the local control unit upon the alarm being presence.

3. The method of claim 1 wherein the step of generating comprises the step of setting the alarm in response to elapse of the predetermined amount of time and the battery being in a low power state by the battery detector.

4. The method of claim 3 wherein the step of transmitting comprises the step of completing the telephone call without the transmitting the voice message upon telephone call being an emergency call.

5. The method of claim 4 wherein the local control unit is a network interface unit connected to a broadband cable.

6. The method of claim 4 wherein the local control unit is a fixed wireless controller.

7. An apparatus for performing the method of claim 1.
8. An apparatus for performing the method of claim 2.
9. An apparatus for performing the method of claim 3.
10. An apparatus for performing the method of claim 4.
11. An apparatus for performing the method of claim 5.
12. An apparatus for performing the method of claim 6.

* * * * *